(12) United States Patent
Ziegler (10) Patent No.: US 10,794,837 B2
(45) Date of Patent: Oct. 6, 2020

(54) ON-WAFER CALIBRATION DEVICE

(71) Applicant: Rohde & Schwarz GmbH & Co. KG, Munich (DE)

(72) Inventor: Robert Ziegler, Surberg (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 577 days.

(21) Appl. No.: 15/648,139

(22) Filed: Jul. 12, 2017

(65) Prior Publication Data
US 2019/0017940 A1 Jan. 17, 2019

(51) Int. Cl.
| | |
|---|---|
| G01N 21/93 | (2006.01) |
| H01L 21/66 | (2006.01) |
| H01L 21/67 | (2006.01) |
| G01R 35/00 | (2006.01) |
| G01R 3/00 | (2006.01) |
| H01L 21/673 | (2006.01) |
| G01R 31/28 | (2006.01) |
| G01R 27/28 | (2006.01) |

(52) U.S. Cl.
CPC ............... *G01N 21/93* (2013.01); *G01R 3/00* (2013.01); *G01R 31/2856* (2013.01); *G01R 35/005* (2013.01); *H01L 21/67011* (2013.01); *H01L 21/67356* (2013.01); *H01L 22/34* (2013.01); *G01R 27/28* (2013.01)

(58) Field of Classification Search
CPC ... H05K 2201/09127; H05K 2203/163; H05K 3/225; H05K 3/10; H05K 3/403; H05K 3/42; H05K 3/429; H05K 3/4638; H05K 3/4644; H05K 3/4679; H05K 1/0225; G01R 1/0466

USPC .......................... 324/750.2, 756.01, 756.02, 324/757.01–757.03, 762.01, 324/763.01–763.02
See application file for complete search history.

(56) References Cited

U.S. PATENT DOCUMENTS

| | | | | |
|---|---|---|---|---|
| 4,329,571 | A | * 5/1982 | Gerig | G06M 1/108 257/E23.179 |
| 4,425,646 | A | * 1/1984 | Kinoshita | G06F 3/0601 360/51 |
| 4,468,795 | A | * 8/1984 | Gerig | G06M 1/108 257/E23.179 |
| 6,617,972 | B2 | * 9/2003 | Takarada | G08B 21/0484 324/538 |
| 6,853,198 | B2 | 2/2005 | Boudiaf et al. | |
| 8,779,729 | B2 | * 7/2014 | Shiraishi | G06F 1/3212 320/155 |
| 2012/0098518 | A1 | * 4/2012 | Unagami | G01R 22/066 324/74 |

FOREIGN PATENT DOCUMENTS

DE 102005018073 A1 9/2006

* cited by examiner

*Primary Examiner* — Giovanni Astacio-Oquendo
(74) *Attorney, Agent, or Firm* — Ditthavong & Steiner, P.C.

(57) ABSTRACT

An on-wafer calibration device comprises on a substrate at least a first measuring port, at least a first switch element, at least two calibration standards, and a controller unit or a control interface for control of the first switch element. The first switch element is controlled in a manner that it selectively connects a wafer probe tip connectable to the first measuring port to the at least two calibration standards.

19 Claims, 5 Drawing Sheets

ON-WAFER CALIBRATION DEVICE

TECHNICAL FIELD

The invention relates to an on-wafer calibration device, especially an on-wafer calibration device on a substrate, for calibrating measuring devices, especially vector network analyzers.

BACKGROUND ART

Generally, in times of an increasing number of applications employing electrical circuits, especially integrated radio frequency circuitry, there is a growing need of well-calibrated measuring devices such as vector network analyzers for testing said circuitry on wafer, and thus a particular need of a calibration device for calibrating said measuring devices in a most efficient and accurate manner with a reference plane located on wafer.

DE 10 2005 018 073 A1 discloses a multi-gate calibration matrix for calibration of multi-gate network analyzers. As this calibration matrix comprises cabling and has quite large structures with respect to radio frequency signals, it is therefore not suitable for an on-wafer calibration of a vector network analyzer in a most efficient and accurate manner. In particular, a calibration reference plane location on wafer is not given in DE 10 2005 018 073 A1. Thus, the calibration technique is not appropriate to accurately measure integrated devices on wafer.

Accordingly, there is a need to provide an on-wafer calibration device especially on a substrate in order to ensure a most efficient and accurate calibration of measuring devices such as vector network analyzers with special respect to radio frequency signals and a resulting reference plane located on wafer.

SUMMARY OF THE INVENTION

According to a first aspect of the invention, an on-wafer calibration device is provided. The on-wafer calibration device comprises on a substrate at least a first measuring port, at least a first switch element, at least two calibration standards, and a controller unit or a control interface for control of the first switch element. The first switch element is controlled in a manner that it selectively connects a wafer probe tip connectable to the first measuring port to the at least two calibration standards. Advantageously, a single touch down, especially a single probe tip touch down, is sufficient in order to perform a calibration with respect to each of the at least two calibration standards. Further advantageously, a n-port system error correction for a measuring device, especially a vector network analyzer, can be carried out with a single touch down of the probe tips. In addition to this, the system error correction may advantageously result in a reference plane located on the wafer, for instance, at the probe tips or beyond.

According to a first preferred implementation form of the first aspect, the first measuring port is implemented as a probe tip pad, especially a radio frequency probe tip pad.

According to a further preferred implementation form of the first aspect, the on-wafer calibration device comprises a second measuring port being arranged non-in-line with respect to the first measuring port.

Additionally or alternatively, the on-wafer calibration device comprises a second measuring port being arranged in-line with respect to the first measuring port. Advantageously, with respect to any arrangement of measuring ports, an accurate calibration is possible.

According to a further preferred implementation form of the first aspect, the second measuring port is arranged in a perpendicular or side-by-side manner with respect to the first measuring port. Additionally or alternatively, the on-wafer calibration device comprises four single ended ports in a perpendicular or side-by-side manner. Advantageously, a calibration for measuring ports with especially a 90 degrees arrangement or the calibration of more than two measuring ports is possible.

According to a further preferred implementation form of the first aspect, the on-wafer calibration device comprises at least two, alternatively at least six, measuring ports, wherein the at least two, alternatively the at least six, measuring ports are arranged in groups of two, alternatively of three, to calibrate for mixed mode signals comprising common mode or differential mode signals.

According to a further preferred implementation form of the first aspect, the on-wafer calibration device comprises at least four, alternatively at least eight, measuring ports, wherein the at least four, alternatively the at least eight, measuring ports are arranged in groups of two, alternatively of four, to calibrate for mixed mode signals comprising common mode or differential mode signals.

According to a further preferred implementation form of the first aspect, the at least two calibration standards comprise thru, open, match, short, reflect, line, attenuator or a predefined network.

According to a further preferred implementation form of the first aspect, the on-wafer calibration device comprises a monolithic combination of switches and calibration standards on the same substrate.

According to a further preferred implementation form of the first aspect, the on-wafer calibration device, especially the controller unit, comprises a temperature sensor for measuring the calibration device temperature. Additionally or alternatively, the substrate temperature can be measured with the aid of the temperature sensor.

According to a further preferred implementation form of the first aspect, the on-wafer calibration device, especially the controller unit, comprises counter means for counting the numbers of calibration events. Advantageously, measuring ports, especially probe tip pads, which are worn out, can be replaced after the maximum number of calibration cycles, preferably between 10 and 20 times, has been reached.

According to a further preferred implementation form of the first aspect, the substrate is a gallium arsenide substrate.

According to a further preferred implementation form of the first aspect, the first switch element is a diode.

According to a further preferred implementation form of the first aspect, the diode is an aluminum gallium arsenide diode, especially an aluminum gallium arsenide PIN diode. Advantageously, such diodes provide low loss and high isolation.

According to a further preferred implementation form of the first aspect, the on-wafer calibration device comprises a coating based on benzocyclobutene above the substrate. Advantageously, the on-wafer calibration device is protected against environmental and mechanical influences to ensure long term durability and handling ruggedness.

According to a further preferred implementation form of the first aspect, the controller unit is coated with a resin. Advantageously, the controller unit and its electrical connections are mechanically protected without interfering the radio frequency structures of the on-wafer calibration device electrically.

According to a further preferred implementation form of the first aspect, the first measuring port comprises gold contacts.

According to a further preferred implementation form of the first aspect, the on-wafer calibration device, preferably the controller unit of the on-wafer calibration device, uses the unused of the measuring device to be calibrated with the aid of the on-wafer calibration device for communication and power supply over the respective at least one radio frequency cable. Advantageously, additional wiring for communication and power supply is made obsolete.

According to a second aspect of the invention, a carrier is provided. The carrier comprises at least two of the on-wafer calibration device according to the first aspect of invention.

According to a third aspect of the invention, a wafer measuring system is provided. The wafer measuring system comprises a temperature controlled wafer chuck having a support for supporting the on-wafer calibration device according to the first aspect of the invention, wherein the chuck is settable to a predefined calibration temperature.

BRIEF DESCRIPTION OF THE DRAWINGS

Exemplary embodiments of the invention are now further explained with respect to the drawings by way of example only, and not for limitation. In the drawings.

DETAILED DESCRIPTION OF THE PREFERRED EMBODIMENTS

Firstly, each of the FIGS. 1a to 1d illustrates an exemplary embodiment of a calibration standard. Each of these calibration standards exemplarily comprises two measuring ports.

In each case according to the FIGS. 1a to 1d, a first measuring port comprises a first ground pad 11a, especially a probe tip pad connected to ground, a signal pad 11b, especially a probe tip pad being connectable to a first measuring signal, and a second ground pad 11c, especially a probe tip connected to ground.

By analogy with the first measuring port described above, in each case according to the FIGS. 1a to 1d, a second measuring port comprises another first ground pad 12a, especially a probe tip pad connected to ground, another signal pad 12b, especially a probe tip pad being connectable to a second measuring signal, and another second ground pad 12c, especially a probe tip pad connected to ground.

In this context, it is noted that each measuring port may alternatively comprise an additional signal pad, especially a probe tip pad being connectable to a further measuring signal or an interference signal, in manner that the alternative pad configuration is ground-signal-signal-ground or ground-signal-ground-signal-ground for mixed mode signals comprising common and differential mode signals. In addition to this, at least one of the pads, especially of the probe tip pads, may comprise or may be made of gold.

Figure 1A:
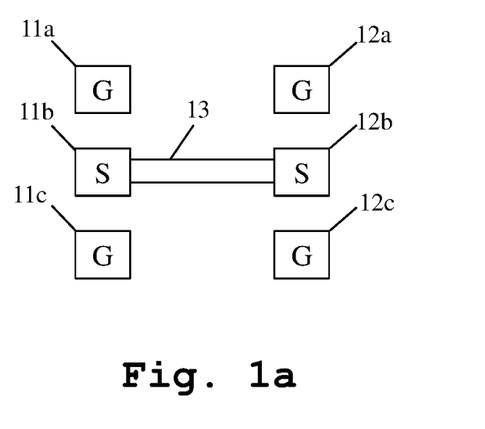
FIG. 1a shows an exemplary embodiment of a thru calibration standard.

Now, with special respect to FIG. 1a, a thru calibration standard is shown. In this case, a conductor 13 connects the signal pad 11b of the first measuring port to the signal pad 12b of the second measuring port.

Figure 1B:
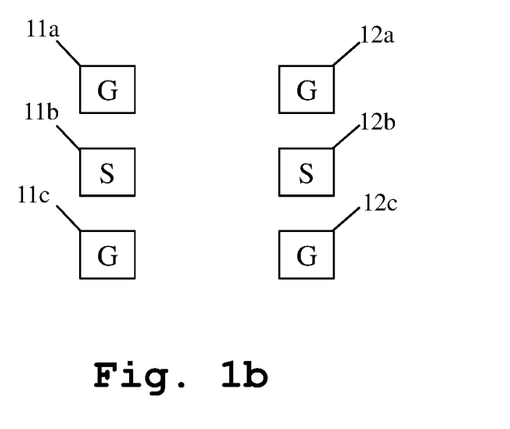
FIG. 1b shows an exemplary embodiment of an open calibration standard.

Furthermore, according to FIG. 1b, an open calibration standard is shown. In this context, there are no connections between any of the pads 11a, 11b, 11c, 12a, 12b, 12c of the first and the second measuring port.

Figure 1C:
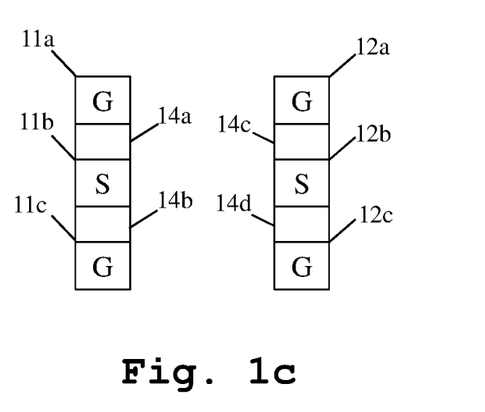
FIG. 1c shows an exemplary embodiment of a short calibration standard.

Moreover, FIG. 1c illustrates an exemplary embodiment of a short calibration standard, wherein with respect to the first measuring port, a first conductor 14a and a second conductor 14b connect the signal pad 11b of the first measuring port to the first ground pad 11a and the second ground pad 11c of first measuring port. In addition to this, by analogy with the first measuring port, with respect to the second measuring port, another first conductor 14c and another second conductor 14d connect the signal pad 12b of the second measuring port to the first ground pad 12a and the second ground pad 12c of second measuring port.

Figure 1D:
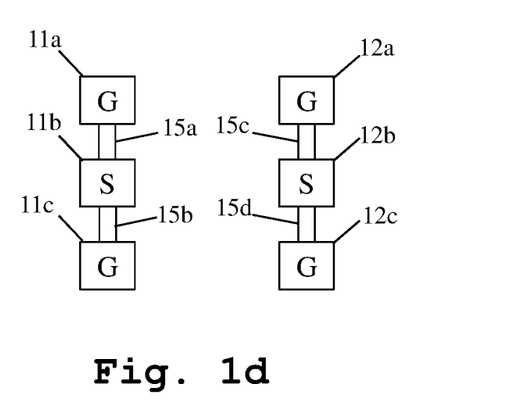
FIG. 1d shows an exemplary embodiment of a matched calibration standard.

Now, in accordance with FIG. 1d, a matched calibration standard is illustrated. In this case, with respect to the first measuring port, the signal pad 11b is connected to the first ground pad 11a of the first measuring port via an impedance 15a, especially a resistor. Additionally, the signal pad 11b of the first measuring port is connected to the second ground pad 11c of the first measuring port via an impedance 15b, especially a resistor. In this context, the impedances 15a, 15b or the resistors 15a, 15b, respectively, especially have the same value, preferably 100 Ohm in order to ensure matching at 50 Ohm. Furthermore, by analogy with the first measuring port, the signal pad 12b of the second measuring port is connected to the first ground pad 12a of the second measuring port via an impedance 15c, especially a resistor. In addition to this, the signal pad 12b of the second measuring port is connected to the second ground pad 12c of the second measuring port via an impedance 15d, especially a resistor. Likewise in an analogous manner, the impedances 15c, 15d or the resistors 15c, 15d, respectively, especially have the same value, preferably 100 Ohm.

Figure 2:
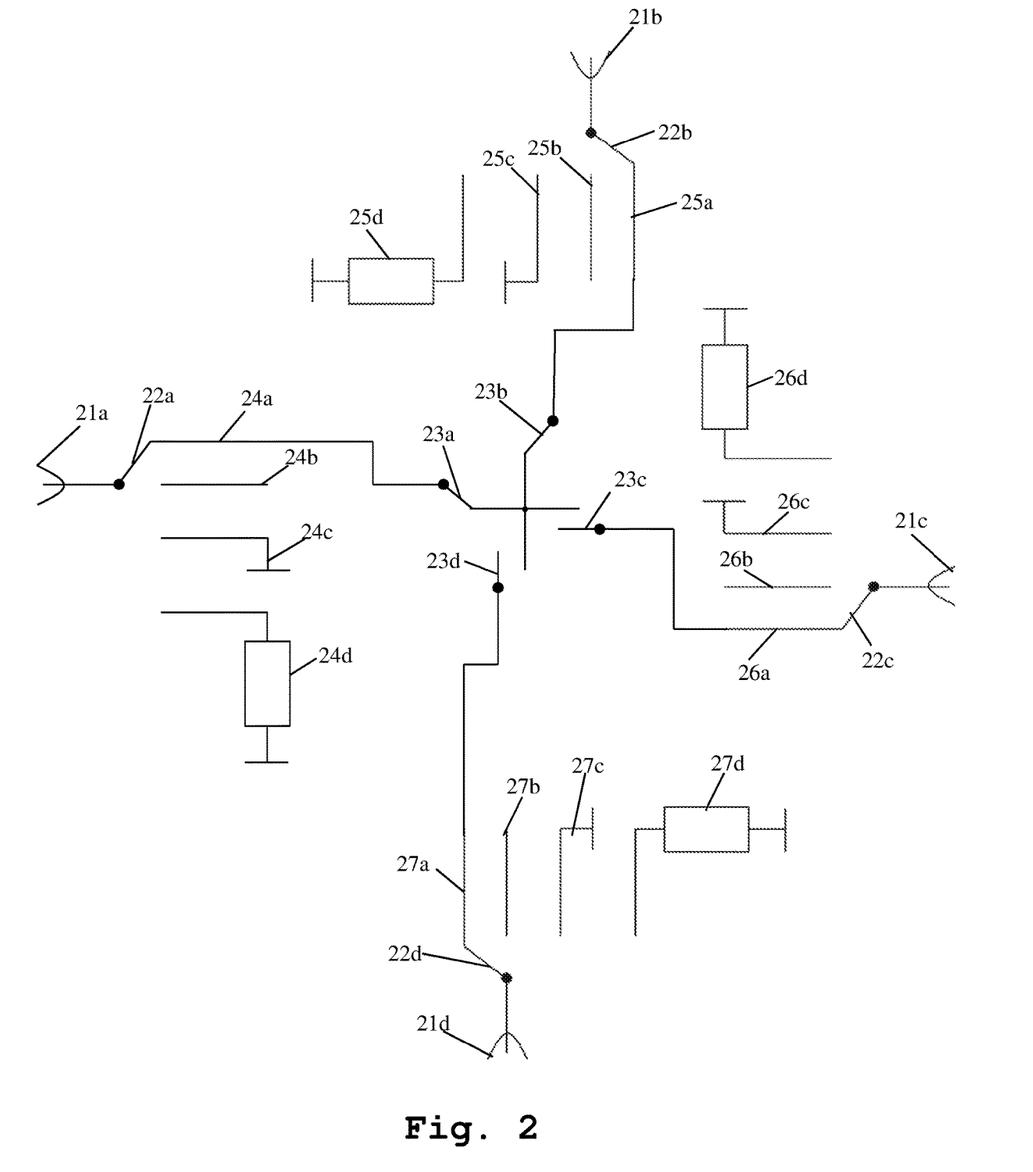
FIG. 2 shows an exemplary embodiment of an on-wafer calibration device.

Now, with respect to FIG. 2, an exemplary embodiment of an on-wafer calibration device is shown. According to FIG. 2, the on-wafer calibration device comprises four measuring ports 21a, 21b, 21c, 21d. Each of these measuring ports 21a, 21b, 21c, 21d especially comprises two ground pads and a signal pad according to the above-mentioned first and second measuring port of FIGS. 1a to 1d. Therefore, the preferred pad configuration of each of the measuring ports 21a, 21b, 21c, 21d is ground-signal-ground.

In this context, it is noted that each measuring port may alternatively comprise an additional signal pad, especially a probe tip pad being connectable to a further measuring signal or an interference signal, in manner that the alternative pad configuration is ground-signal-signal-ground or ground-signal-ground-signal-ground for mixed mode signals especially comprising common and differential mode signals.

Furthermore, each of the four measuring ports 21a, 21b, 21c, 21d is connected to a respective switch 22a, 22b, 22c, 22*d* in order to switch between the corresponding calibration standards of the respective measuring port. Each of the switches 22*a*, 22*b*, 22*c*, 22*d* is switchable between a thru calibration standard 24*a*, 25*a*, 26*a*, 27*a*, an open calibration standard 24*b*, 25*b*, 26*b*, 27*b*, a short calibration standard 24*c*, 25*c*, 26*c*, 27*c*, and a matched calibration standard 24*d*, 25*d*, 26*d*, 27*d*, preferably with matching at 50 Ohm.

Additionally or alternatively, further calibration standards can be implemented such as a reflect calibration standard, a line calibration standard, an attenuator calibration standard or a known network calibration standard. In this context, each of the switches 22*a*, 22*b*, 22*c*, 22*d* may preferably be switchable between the respective calibration standards.

Moreover, with special respect to said thru calibration standards 24*a*, 25*a*, 26*a*, 27*a*, the on-wafer calibration device comprises further switches 23*a*, 23*b*, 23*c*, 23*d* especially arranged as a star in order to connected the desired ones of the measuring ports 21*a*, 21*b*, 21*c*, 21*d*. For a three port on-wafer calibration device a triangle arrangement is possible. Preferably, the desired measuring ports 21*a*, 21*b*, 21*c*, 21*d* are connected pairwise during calibration.

In addition to this, it is noted that at least two of the measuring ports 21*a*, 21*b*, 21*c*, 21*d* can be combined in a manner that they form at least one mixed mode especially comprising differential and common mode measuring port.

Furthermore, the on-wafer calibration device according to FIG. 2 is arranged on a substrate, especially a gallium arsenide substrate. Additionally, at least one or each of the switches 22*a*, 22*b*, 22*c*, 22*d*, 23*a*, 23*b*, 23*c*, 23*d* is realized using at least one diode, preferably a pin-diode, more preferably an aluminum gallium arsenide diode, most preferably an aluminum gallium arsenide pin-diode. Advantageously, on the substrate, especially on the gallium arsenide substrate, the on-wafer calibration device comprises a monolithic combination of switches and calibration standards.

Figure 3A:
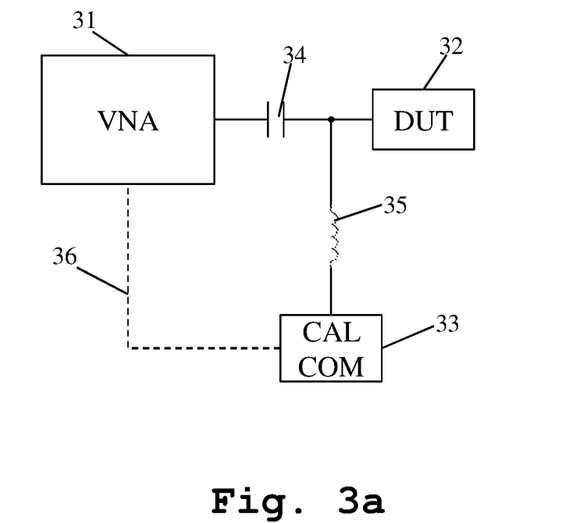
FIG. 3a shows an exemplary embodiment of a bias concept for an on-wafer calibration device.

FIG. 3*a* illustrates a Bias-T for a device under test 32 or an on-wafer calibration device according to FIG. 2, respectively. In this context, a measuring device 31, especially a vector network analyzer, is connected via a capacitance 34, especially a capacitor, to the device under test 32. Additionally, the signal path between said capacitance 34 and said device under test 32 is connected to a calibration communication unit 33 via an inductance 33, especially a coil. For the purpose of communication, the calibration communication unit 33 may especially be connected to the measuring device 31 via an optional connection 36. Alternatively, the calibration communication unit 33 may preferably be part of the measuring device 31.

Now, with special respect to the functionality of the Bias-T according to FIG. 3, it is noted that especially to control and bias the switches of an on-wafer calibration device such as the one according to FIG. 2, the unused spectrum from DC to the lower cut-off frequency of the measuring device 31 is used, exemplarily DC to 10 MHz. In this context, the DC bias and control signals are carried by the respective radio frequency cable, which advantageously makes additional connections for biasing and controlling obsolete.

Figure 4:
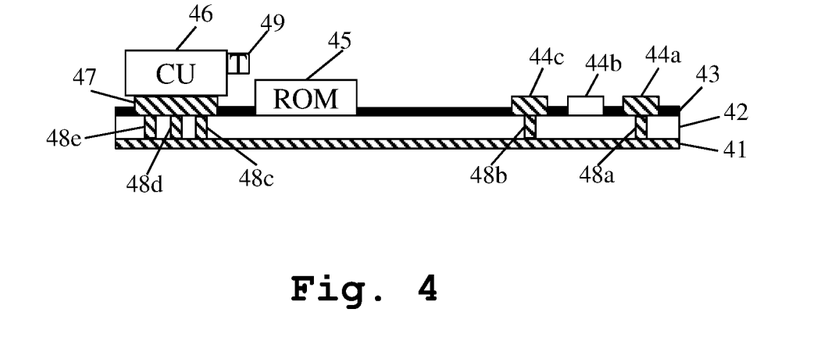
FIG. 4 shows an exemplary embodiment of a cross section of an on-wafer calibration device.

In addition to this, it is noted that the decoding of the control signals and the DC driver for the switches is preferably realized with an integrated controller chip, especially a controller unit preferably based on complementary metal oxide semiconductors (CMOS) technology, which will be shown in the context of FIG. 4.

Figure 3B:
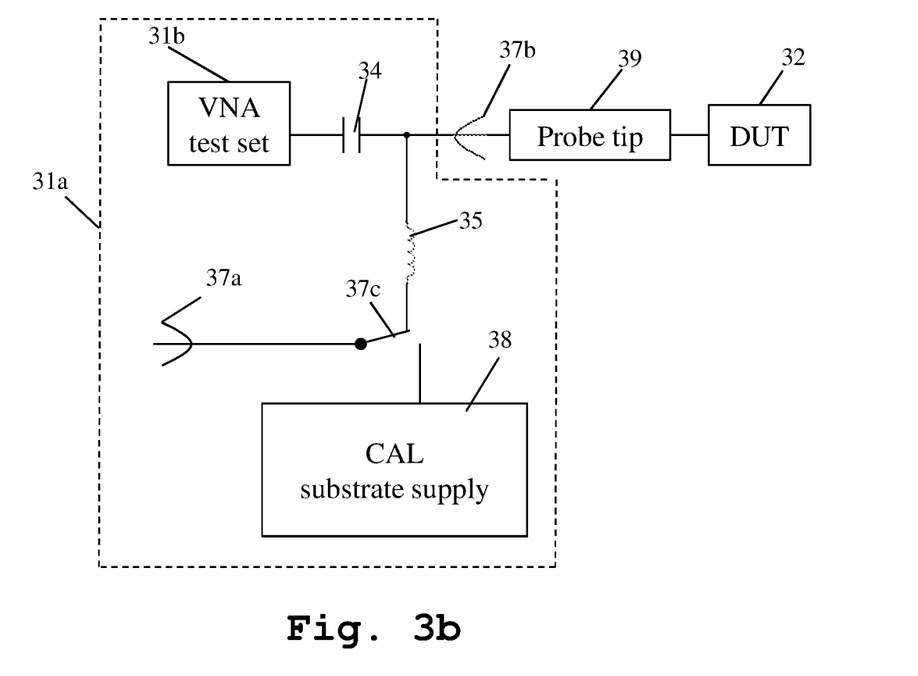
FIG. 3b shows an alternative exemplary embodiment of a bias concept for an on-wafer calibration device.

FIG. 3*b* illustrates an alternative Bias-T for a device under test 32 or an on-wafer calibration device according to FIG. 2, respectively. In this context, a measuring device 31*a*, especially a vector network analyzer, comprises a vector network analyzer test set 31*b*, a capacitance 34, an inductance 35, an external bias port 37*a*, a switch 37*c*, and a calibration substrate supply 38. The vector network analyzer test set 31*b* is connected via the capacitance 34, especially a capacitor, via a radio frequency port 37*b* of the vector network analyzer 31*a* and a probe tip 39 to the device under test 32. In this context, the device under test 32 may also be a calibration substrate. Additionally, the signal path between said capacitance 34 and said radio frequency port 37*b* is connected to the switch 37*c* via the inductance 33, especially a coil. With the aid of the switch 37*c*, it can be switched between said external bias port 37*a* for biasing with the aid of an external signal and the calibration substrate supply 38.

FIG. 4 illustrates a cross section of an exemplary embodiment of circuit board configuration of an on-wafer calibration device. The circuit board configuration comprises a ground plane 41 as a bottom layer on the back side, and a substrate layer 42, especially a gallium arsenide substrate layer.

Furthermore, the circuit board configuration especially comprises an on-wafer calibration device such as the one according to FIG. 2, a measuring port of which is exemplarily depicted. Said measuring port comprises two ground pads 44*a*, 44*c*, especially probe tip pads connected electrically to the ground plane 41 with the aid of the respective vias 48*a*, 48*b*, and a signal pad 44*b*, especially a probe tip pad being connectable to a signal.

In addition to this, as already announced above, the circuit board configuration further comprises a controller unit 46 for biasing and controlling the switches of the on-wafer calibration device. As it can be seen, the controller unit 46 is arranged in a chip-on-chip manner with respect to the on-wafer calibration device on the substrate 42. In this context, the controller unit 46 is preferably arranged on a ground pad 47, especially a pad connected to ground with the aid of exemplarily three vias 48*c*, 48*d*, 48*e*, and especially fixed with the aid of die adhesive, especially silver conductive adhesive. In addition to this, the respective pins of the controller unit 46 for biasing and controlling the switches of the on-wafer calibration device are connected to the corresponding points of the on-wafer calibration device with the aid of bonding wires or in a flip-chip manner. Additionally, especially for the purpose of mechanical and environmental protection, the controller unit 46 and its electrical connections are encapsulated with the aid of a resin. In this context, it is to be pointed out that especially the radio frequency structures of the on-wafer calibration device are not coated with any resin in order to avoid additional losses or reduced radio frequency isolation.

Moreover, the on-wafer calibration device comprises a benzocyclobutene (BCB) passivation 43 above the substrate 42 for mechanical and environmental protection. Therefore, unintentional touching of the on-wafer calibration device is not harmful (e.g., crushed air bridges). Advantageously, the coating of the controller unit 46 based on resin and said BCB protection 43 of the on-wafer calibration device make the device robust for field applications.

Further advantageously, especially the probe tip pads 44*a*, 44*b*, 44*c* may be made with an enforced (thick) gold layer to ensure a minimum number of secure, reproducible and well-connected touch downs of radio frequency probe tips, preferably between 10 and 20 times. In this context, the controller unit 46 may especially count the applied calibration cycles and store the respective number with the aid of a memory arranged on the circuit board configuration, preferably an electrically erasable read only memory 45, more preferably a memory based on fuses. Alternatively, the read only memory 45 may preferably be arranged on the circuit board in a manner such as the controller unit 46. Further alternatively, the controller may comprise a memory, especially an electrically erasable read only memory. Advantageously, after a specified minimum of guaranteed cycles or touch downs, m respectively, the user can be informed that a correct calibration cannot be guaranteed anymore since the respective probe tip pads 44a, 44b, 44c are worn out.

Furthermore, with special respect to automatic calibration or probing, the on-wafer calibration device, especially the on-wafer calibration device on a substrate, may preferably be delivered in magazines allowing for an automatic change for auto-probe stations.

In addition to this, the controller unit 46 may preferably comprise a temperature sensor 49 in order to ensure that the on-wafer calibration device, especially the on-wafer calibration device on the substrate, is applied within the specified temperature range for which the respective calibration standard data is valid.

At this point, it is generally noted that it is preferred to individually characterize and store the respective calibration standard data for a system error correction procedure. To get the calibration standard data to the measuring device, especially a vector network analyzer, the respective calibration standard data can be stored either with the aid of the read only memory 45 or each individual on-wafer calibration device gets a serial number. In case of the serial number approach, the individual calibration standard data may preferably be downloaded from the internet or delivered with the aid of an external storage such as a compact disc. As an alternative for the read only memory 45, an additional memory, especially a further read only memory, may be implemented on the on-wafer calibration device or the controller unit 46 may comprise an additional memory, especially a further read only memory.

Figure 5:
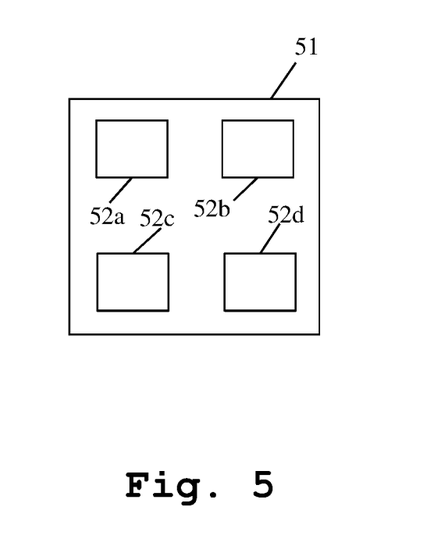
FIG. 5 shows an exemplary embodiment of a carrier comprising four on-wafer calibration devices.

Now, with respect to FIG. 5 an exemplary embodiment of a carrier 51 comprising four on-wafer calibration devices 52a, 52b, 52c, 52d such as the one according to FIG. 2 is shown. Additionally, each of the on-wafer calibration devices 52a, 52b, 52c, 52d may preferably comprise at least one of the components of FIG. 4 such as the controller unit 46 or the read only memory 45.

Figure 6:
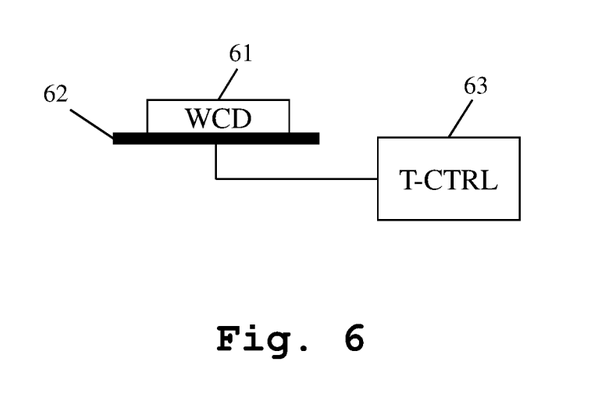
FIG. 6 shows an exemplary embodiment of a wafer measuring system.

Finally, FIG. 6 illustrates a wafer measuring system comprising temperature controlled wafer chuck 62 having a support for supporting an on-wafer calibration device 61 such as the one according to FIG. 2 or one of the carrier according to FIG. 5, wherein the wafer chuck 62 is settable to a predefined calibration temperature with the aid of a temperature controlling unit 63.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. An on-wafer calibration device comprising on a substrate:
    a first measuring port,
    a first switch element,
    at least two calibration standards, and
    a controller unit or a control interface for control of the first switch element,
    wherein the first switch element is controlled in a manner that it selectively connects a wafer probe tip connectable to the first measuring port to the at least two calibration standards.

2. The on-wafer calibration device according to claim 1, wherein the first measuring port is implemented as a probe tip pad.

3. The on-wafer calibration device according to claim 1, wherein the on-wafer calibration device comprises a second measuring port being arranged non-in-line with respect to the first measuring port.

4. The on-wafer calibration device according to claim 3, wherein the second measuring port is arranged in a perpendicular or side-by-side manner with respect to the first measuring port.

5. The on-wafer calibration device according to claim 1, wherein the on-wafer calibration device comprises at least two measuring ports, wherein the at least two measuring ports are arranged in groups of two to calibrate for mixed mode signals comprising common mode or differential mode signals.

6. The on-wafer calibration device according to claim 1, wherein the on-wafer calibration device comprises at least four measuring ports, wherein the at least four measuring ports are arranged in groups of two to calibrate for mixed mode signals comprising common mode or differential mode signals.

7. The on-wafer calibration device according to claim 1, wherein the at least two calibration standards comprise thru, open, match, short, reflect, line, attenuator or a predefined network.

8. The on-wafer calibration device according to claim 1, wherein the on-wafer calibration device comprises a monolithic combination of switches and calibration standards on the same substrate.

9. The on-wafer calibration device according to claim 1, wherein the on-wafer calibration device, especially the controller unit, comprises a temperature sensor for measuring the calibration device temperature.

10. The on-wafer calibration device according to claim 1, wherein the on-wafer calibration device, especially the controller unit, comprises counter means for counting the numbers of calibration events.

11. The on-wafer calibration device according to claim 1, wherein the substrate is a gallium arsenide substrate.

12. The on-wafer calibration device according to claim 1, wherein the first switch element is a diode.

13. The on-wafer calibration device according to claim 12, wherein the diode is an aluminum gallium arsenide diode.

14. The on-wafer calibration device according to claim 1, wherein the on-wafer calibration device comprises a coating based on benzocyclobutene above the substrate.

15. The on-wafer calibration device according to claim 1, wherein the controller unit is coated with a resin.

16. The on-wafer calibration device according to claim 1, wherein the first measuring port comprises gold contacts.

17. The on-wafer calibration device according to claim 1, wherein the controller unit uses an unused portion of the first measuring port to be calibrated with aid of the on-wafer calibration device for communication and power supply over at least one radio frequency cable.

18. A carrier comprising:

at least two on-wafer calibration devices on a substrate, each on-wafer calibration device comprising:
- a first measuring port,
- a first switch element,
- at least two calibration standards, and
- a controller unit or a control interface for control of the first switch element,
- wherein the first switch element is controlled in a manner that it selectively connects a wafer probe tip connectable to the first measuring port to the at least two calibration standards.

19. A wafer measuring system comprising:

a temperature controlled wafer chuck comprising a support;

an on-wafer calibration device on a substrate, the on-wafer calibration device supported by the support and the on-wafer calibration device comprises:
- a first measuring port,
- a first switch element,
- at least two calibration standards, and
- a controller unit or a control interface for control of the first switch element,
- wherein the first switch element is controlled in a manner that it selectively connects a wafer probe tip connectable to the first measuring port to the at least two calibration standards, and
- wherein the chuck is settable to a predefined calibration temperature.

\* \* \* \* \*